United States Patent
McWhirter et al.

(10) Patent No.: US 9,613,828 B2
(45) Date of Patent: Apr. 4, 2017

(54) METHOD OF LASER ANNEALING A SEMICONDUCTOR WAFER WITH LOCALIZED CONTROL OF AMBIENT OXYGEN

(71) Applicant: Ultratech, Inc., San Jose, CA (US)

(72) Inventors: James McWhirter, San Jose, CA (US); Arthur W. Zafiropoulo, Atherton, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 14/714,544

(22) Filed: May 18, 2015

(65) Prior Publication Data

US 2016/0343583 A1    Nov. 24, 2016

Related U.S. Application Data

(60) Provisional application No. 62/016,134, filed on Jun. 24, 2014.

(51) Int. Cl.
  *H01L 21/00* (2006.01)
  *H01L 21/84* (2006.01)
  (Continued)

(52) U.S. Cl.
  CPC .......... *H01L 21/324* (2013.01); *H01L 21/268* (2013.01)

(58) Field of Classification Search
  CPC ........ H01L 21/33; H01L 21/268; H01L 21/00
  (Continued)

(56) References Cited

U.S. PATENT DOCUMENTS 5,997,963 A * 12/1999 Davison .................. C23C 16/44
                                                118/722
6,242,291 B1 * 6/2001 Kusumoto .......... H01L 21/2026
                                                257/E21.134
(Continued)

FOREIGN PATENT DOCUMENTS

JP        H07-245311 A      9/1995
JP        H10-172919 A     12/1996
(Continued)

OTHER PUBLICATIONS

Office Action from Taiwan Office Action Dated Apr. 27, 2016 for Taiwan Counterpart Patent Application No. 104119189.
(Continued)

*Primary Examiner* — Yuanda Zhang
*Assistant Examiner* — Sheikh Maruf
(74) *Attorney, Agent, or Firm* — Opticus IP Law PLLC (57) ABSTRACT

Laser annealing of a semiconductor wafers using a forming gas for localized control of ambient oxygen gas to reduce the amount of oxidization during laser annealing is disclosed. The forming gas includes hydrogen gas and an inert buffer gas such as nitrogen gas. The localized heating of the oxygen gas and the forming gas in the vicinity of the annealing location on the surface of the semiconductor wafer creates a localized region within which combustion of oxygen gas and hydrogen gas occurs to generate water vapor. This combustion reaction reduces the oxygen gas concentration within the localized region, thereby locally reducing the amount of ambient oxygen gas, which in turn reduces oxidation rate at the surface of the semiconductor wafer during the annealing process.

20 Claims, 5 Drawing Sheets (51) Int. Cl.
*H01L 21/31* (2006.01)
*H01L 21/324* (2006.01)
*H01L 21/268* (2006.01)

(58) Field of Classification Search
USPC .................. 438/799, 479, 149, 158, 758
See application file for complete search history.

(56) References Cited

U.S. PATENT DOCUMENTS

| | | | |
|---|---|---|---|
| 6,747,245 B2 | 6/2004 | Talwar et al. | |
| 7,098,155 B2 | 8/2006 | Talwar et al. | |
| 7,220,461 B2 | 5/2007 | Hasebe et al. | |
| 7,253,032 B2 | 8/2007 | Yamazaki et al. | |
| 7,521,378 B2* | 4/2009 | Fucsko | H01L 21/316 257/E21.489 |
| 7,700,460 B2 | 4/2010 | Sato et al. | |
| 7,763,828 B2 | 7/2010 | Talwar et al. | |
| 8,153,538 B1* | 4/2012 | Shive | H01L 21/3225 257/347 |
| 8,309,474 B1 | 11/2012 | Wang et al. | |
| 9,029,809 B2* | 5/2015 | Pun | B23K 26/127 219/121.84 |
| 2002/0192885 A1* | 12/2002 | Miyasaka | H01L 29/66757 438/164 |
| 2006/0051966 A1* | 3/2006 | Or | H01J 37/32082 438/706 |
| 2006/0264060 A1* | 11/2006 | Ramaswamy | C23C 16/26 438/758 |
| 2007/0032054 A1* | 2/2007 | Ramaswamy | C23C 16/26 438/513 |
| 2008/0213986 A1* | 9/2008 | Kusumoto | H01L 21/2026 438/487 |
| 2008/0258302 A1* | 10/2008 | Beinglass | H01L 21/26513 257/751 |
| 2009/0181553 A1* | 7/2009 | Koelmel | C23C 16/4586 438/799 |
| 2009/0286382 A1* | 11/2009 | Huff | C23F 4/00 438/455 |
| 2011/0186984 A1* | 8/2011 | Saito | H01L 21/02186 257/734 |
| 2013/0330844 A1* | 12/2013 | Hawryluk | H01L 22/12 438/5 |
| 2014/0015548 A1* | 1/2014 | Naughton | G01R 27/26 324/658 |
| 2014/0118751 A1* | 5/2014 | Rajagopalan | H01L 21/00 356/630 |
| 2015/0311067 A1* | 10/2015 | Sharma | H01L 21/02332 438/783 |

FOREIGN PATENT DOCUMENTS

| | | |
|---|---|---|
| JP | 2001-168029 A | 6/2001 |
| JP | 2002-217124 A | 8/2002 |
| JP | 2009-099917 A | 5/2009 |

OTHER PUBLICATIONS

Office Action from Japanese Patent Office Action Dated Sep. 27, 2016, for Counterpart Japanese Patent Application No. 2015-107113.

* cited by examiner

//<!-- -->
METHOD OF LASER ANNEALING A SEMICONDUCTOR WAFER WITH LOCALIZED CONTROL OF AMBIENT OXYGEN

CROSS-REFERENCE TO RELATED APPLICATIONS

The present application claims priority under 35 U.S.C. 119 from U.S. Provisional Patent Application No. 62/016,134, which is incorporated by reference herein.

FIELD

The present disclosure relates to laser annealing, and in particular relates to methods of laser annealing with localized control of ambient oxygen.

The entire disclosure of any publication or patent document mentioned herein is incorporated by reference, including U.S. Pat. Nos. 5,997,963; 6,747,245; 7,098,155; 7,157,660; 7,763,828; 8,309,474, and 9,029,809.

BACKGROUND

Laser annealing (also called laser spike annealing, laser thermal annealing, laser thermal processing, etc.) is used in semiconductor manufacturing for a variety of applications, including for activating dopants in select regions of devices (structures) formed in a semiconductor wafer when forming active microcircuits such as transistors and related types of semiconductor features.

The laser annealing process typically takes place under vacuum in a process (or reaction) chamber, such as the microchamber discussed in U.S. Pat. Nos. 5,997,963 and 9,029,809. One reason for using a vacuum is to reduce the amount of oxygen gas present at the surface of the semiconductor wafer being processed because the oxygen gas is highly reactive and will oxidize the surface of the semiconductor wafer. This is especially true at the high temperatures associated with laser annealing since the higher temperatures increase the rate of oxidization.

Under normal vacuum conditions, the oxygen gas concentration in the interior of the process chamber can be reduced to about 50 parts-per-million (ppm) (vol.). Reducing the oxygen gas concentration further is problematic and requires expensive equipment (e.g., a more powerful vacuum pump), and as well as substantial modifications to the process chamber.

It is therefore desirable to have a low-cost and simple way of reducing the amount of oxygen gas at the surface of the semiconductor wafer being laser annealed beyond what can achieved using conventional vacuum-based approaches.

SUMMARY

An aspect of the disclosure is a method of laser annealing a semiconductor wafer having a surface. The method includes: arranging the semiconductor wafer in an interior of a process chamber; pulling a vacuum in the interior of the process chamber such that the interior of the process chamber includes $O_2$ at an initial $O_2$ concentration; introducing a forming gas into the process chamber, the forming gas including $H_2$ and a buffer gas; and directing a laser beam to pass through the interior of the process chamber to be incident upon the surface of the semiconductor wafer at an annealing location, thereby annealing the surface of the semiconductor wafer and also causing localized heating of the $O_2$ and the $H_2$ of the forming gas in a localized region surrounding the annealing location and within which combustion of $O_2$ and $H_2$ occurs to generate $H_2O$ vapor, thereby reducing the concentration of $O_2$ in the localized region as compared to the initial $O_2$ concentration.

Another aspect of the disclosure is the method as described above, the forming gas preferably includes 5 vol % $H_2$ and 95 vol % $N_2$.

Another aspect of the disclosure is the method as described above, the localized region is preferably defined by a combustion temperature $T_C$ in the range from 100° C. to 500° C.

Another aspect of the disclosure is the method as described above, the process chamber preferably comprises a microchamber.

Another aspect of the disclosure is the method as described above, the method preferably further includes moving the semiconductor wafer relative to the laser beam so that the annealing location moves relative to the surface of the semiconductor wafer but stays stationary relative to its initial position in the interior of the process chamber.

Another aspect of the disclosure is the method as described above, the initial $O_2$ concentration is preferably 50 ppm (vol.) or greater. The reduced $O_2$ concentration is preferably 10 ppm (vol.) or smaller.

Another aspect of the disclosure is the method as described above, the semiconductor wafer preferably has a melt temperature $T_M$. The annealing of the surface of the semiconductor wafer is preferably performed at an annealing temperature $T_A<T_M$.

Another aspect of the method of reducing oxygen gas in a localized region surrounding an annealing location during annealing of a semiconductor wafer having a surface. The method includes: introducing a forming gas of hydrogen gas and a buffer gas into a process chamber that contains the semiconductor wafer and the oxygen gas at an initial concentration; and laser annealing the surface of the semiconductor wafer, thereby causing localized heating of the oxygen gas and the hydrogen gas of the forming gas in a localized region surrounding the annealing location and within which combustion of oxygen gas and hydrogen gas occurs to generate water vapor, thereby reducing the concentration of oxygen gas in the localized region as compared to the initial concentration of the oxygen gas.

Another aspect of the disclosure is the method as described above, the buffer gas preferably includes 5 vol % hydrogen gas and 95 vol % nitrogen gas.

Another aspect of the disclosure is the method as described above, the localized region is preferably defined by a combustion temperature $T_C$ in the range from 100° C. to 500° C.

Another aspect of the disclosure is the method as described above, the process chamber preferably comprises a microchamber.

Another aspect of the disclosure is the method as described above, the process chamber preferably has a pressure less than atmospheric pressure.

Another aspect of the disclosure is the method as described above, the method preferably further includes moving the semiconductor wafer relative to a laser beam so that the annealing location moves relative to the surface of the semiconductor wafer but stays stationary relative to its initial position in the interior of the process chamber.

Another aspect of the disclosure is the method as described above, the initial concentration of the oxygen gas is preferably 50 ppm (vol.) or greater. The reduced oxygen concentration is preferably 10 ppm (vol.) or smaller.

Another aspect of the disclosure is the method as described above, the semiconductor wafer preferably has a melt temperature $T_M$. The annealing of the surface of the semiconductor wafer is preferably performed at an annealing temperature $T_A < T_M$.

Another aspect of the disclosure is the method of laser annealing a semiconductor wafer having a surface. The method includes: arranging the semiconductor wafer in an interior of a process chamber that includes $O_2$ at an initial $O_2$ concentration; introducing into the process chamber a forming gas comprising $H_2$ and a buffer gas; and directing a laser beam to pass through the interior of the process chamber to be incident upon the surface of the semiconductor wafer at an annealing location, thereby annealing the surface of the semiconductor wafer and also causing localized heating of the $O_2$ and the $H_2$ of the forming gas in a localized region surrounding the annealing location and within which combustion of $O_2$ and $H_2$ occurs to generate $H_2O$ vapor, thereby reducing the concentration of $O_2$ in the localized region as compared to the initial $O_2$ concentration.

Another aspect of the disclosure is the method as described above, the method preferably further includes pulling a vacuum after arranging the semiconductor wafer in the interior of the process chamber. The initial $O_2$ concentration is defined by an amount (concentration) of residual $O_2$ that remains in the process chamber after pulling the vacuum.

Another aspect of the disclosure is the method as described above, the initial $O_2$ concentration is preferably 50 ppm (vol.) or greater. The reduced $O_2$ concentration is preferably 10 ppm (vol.) or smaller.

Another aspect of the disclosure is the method as described above, the process chamber preferably comprises a microchamber.

Another aspect of the disclosure is the method as described above, the buffer gas preferably consists of 5 vol % hydrogen gas and 95 vol % nitrogen gas.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this detailed description.

The entire disclosure of any publication or patent document mentioned herein is incorporated by reference.

Cartesian coordinates are shown in some of the Figures for the sake of reference and are not intended to be limiting as to direction or orientation.

In the description below, the term "pulling a vacuum" or the term "evacuated" in connection with the process chamber interior means reducing the pressure of the process chamber interior to be below that of ambient or atmospheric pressure outside of the process chamber, and does not necessarily mean the removal (evacuation) of all atoms from the process chamber interior. The example methods disclosed herein include pulling a vacuum in the process chamber interior or otherwise evacuating the process chamber, wherein the process chamber interior is left with an initial concentration $C_{OX}$ of oxygen gas. In this context, the term "initial concentration" is used to indicate that the methods of performing localized control of the oxygen gas content in the process chamber are performed starting with this concentration and ending with a reduced concentration as compared to the initial concentration $C_{OX}$.

The words "process" and "method" are used interchangeably herein.

The phrase "localized control of ambient oxygen gas" is understood to mean the localized reduction of an amount (concentration) of oxygen gas relative to an initial amount (concentration) of oxygen gas.

Process Chamber System

Figure 1A:
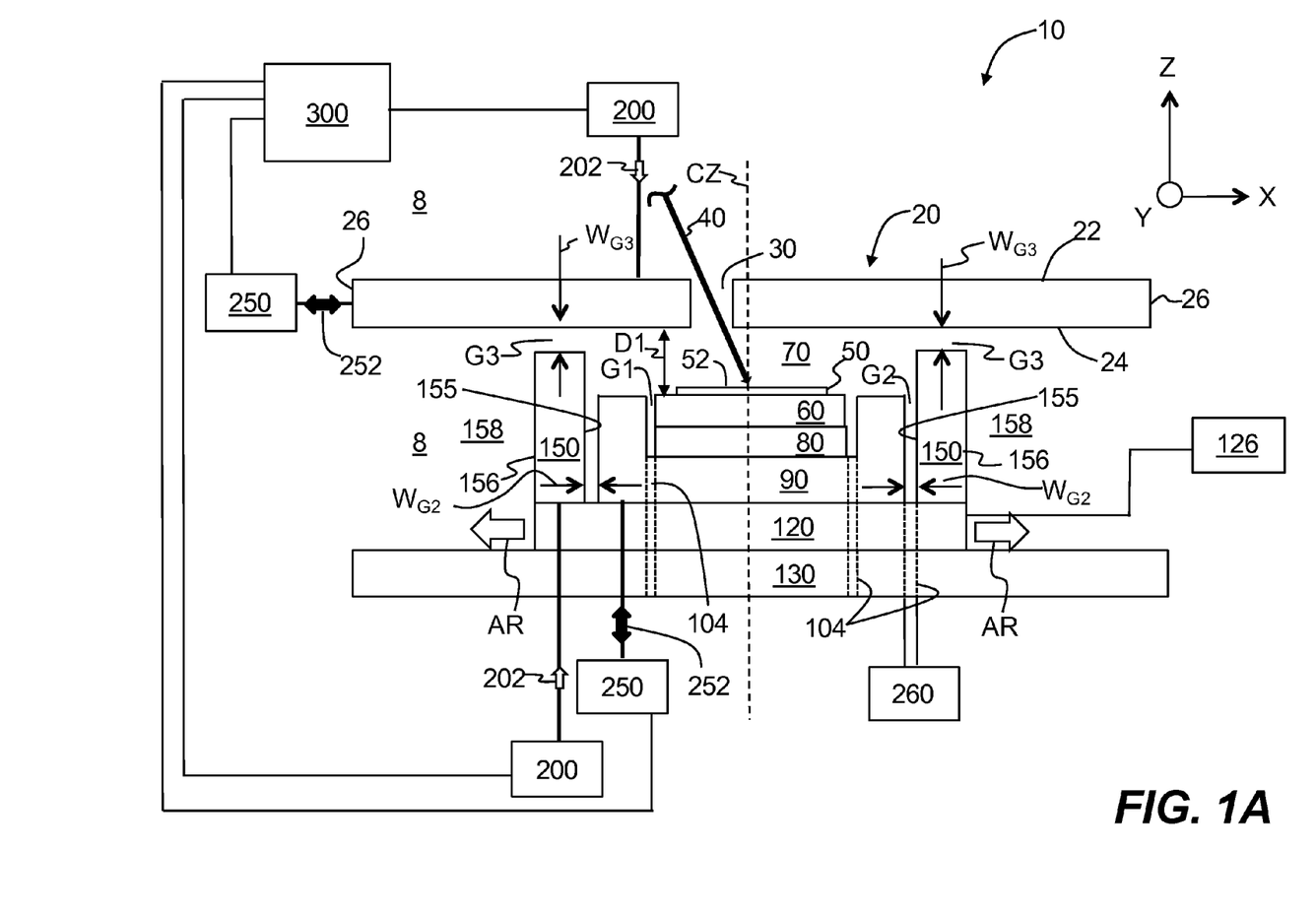
FIG. 1A is a schematic cross-sectional diagram (in the X-Z plane) of an example embodiment of process chamber system suitable for use in carrying out the annealing and localized control of ambient oxygen gas ($O_2$) methods disclosed herein.
Figure 1B:
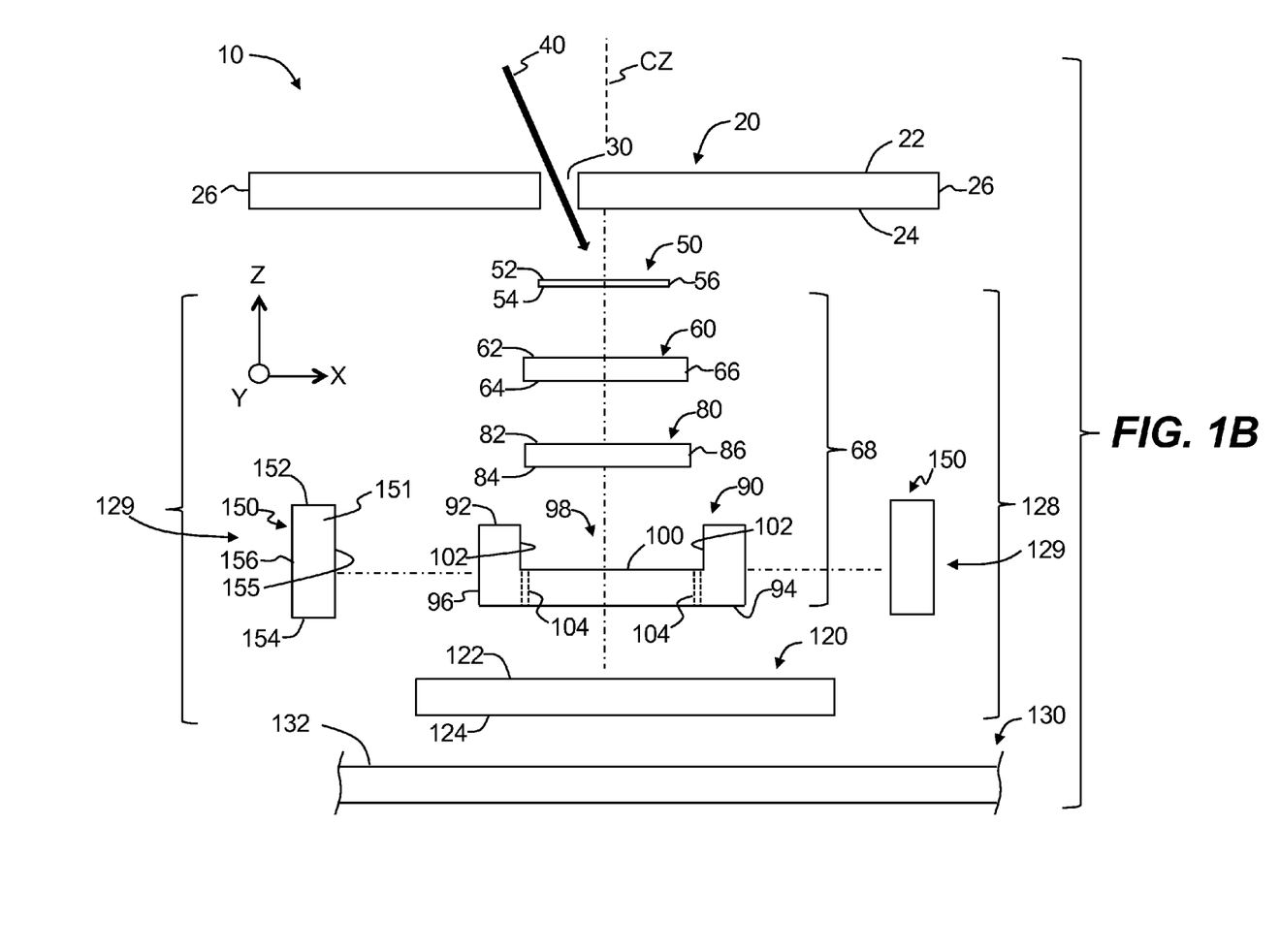
FIG. 1B is an exploded view of some of the main components of the process chamber system of FIG. 1A.
Figure 1C:
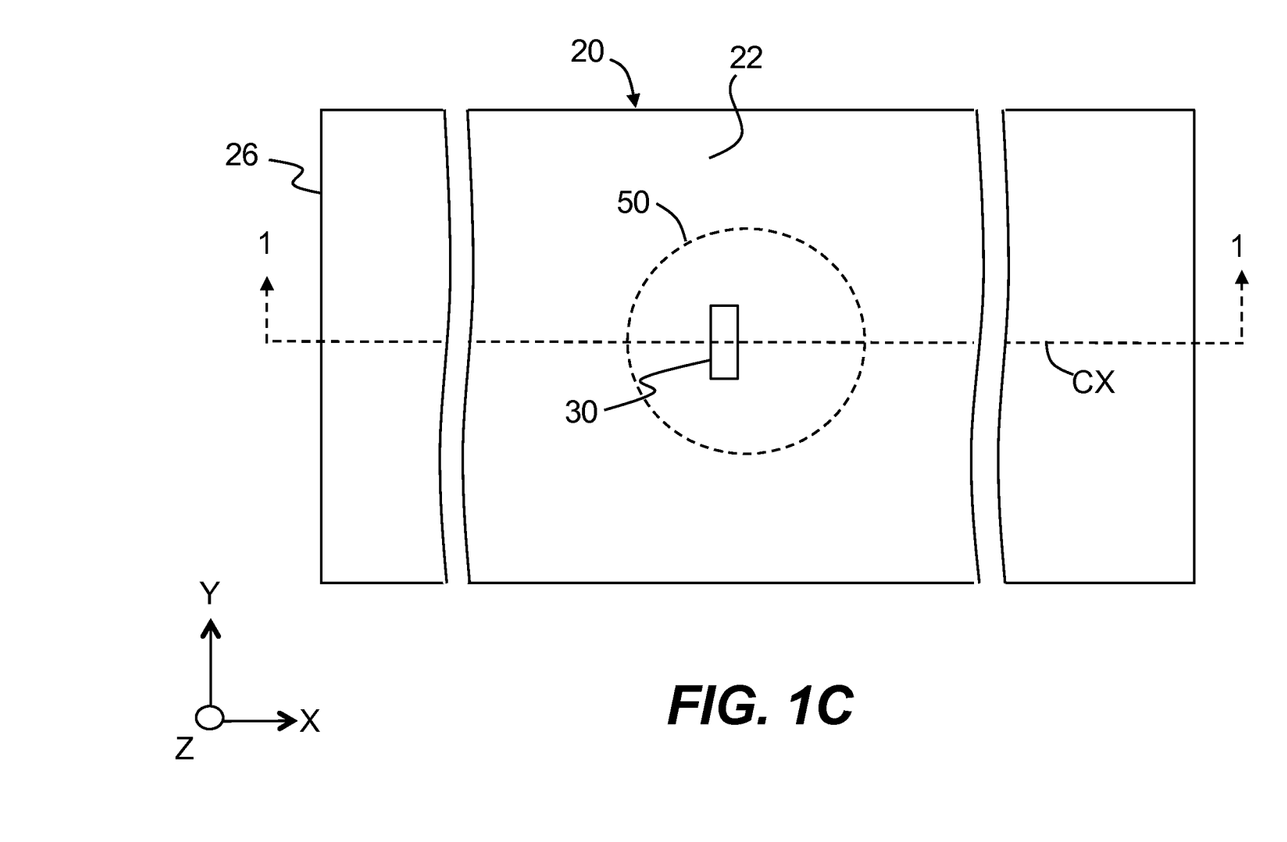
FIG. 1C is a top-down view (in the X-Y plan) of the process chamber system of FIG. 1A, with the line 1-1 showing the cross-section taken for FIG. 1A.

FIG. 1A is a schematic cross-sectional diagram (in the X-Z plane) of an example embodiment of a process chamber system ("system") 10 suitable for use in carrying out the methods disclosed herein. FIG. 1B is an exploded view of some of the main components of system 10 of FIG. 1A. FIG. 2C is a top-down view of the system 10 (in the X-Y plan)

of FIG. 1A, with line 1-1 showing the cross-section taken for FIG. 1A. FIGS. 1A through 1C are from the '344 publication and describe a type of process chamber referred to as a "microchamber."

The system 10 has a Z-centerline CZ that runs in the Z-direction and an X-centerline CX that runs in the X-direction. The system 10 resides in an ambient environment 8 that may include at least one reactive gas, such as oxygen gas. It may also include non-reactive gasses, such as neon gas or argon gas, or stable gases, such as nitrogen gas.

The system 10 includes a top member 20 having an upper surface 22, a lower surface 24 and an outer edge 26. In an example, the top member 20 is generally rectangular in shape and has parallel upper and lower surfaces 22 and 24. In an example, the top member 20 is cooled, as described in greater detail below. In an example, the top member 20 includes at least one light-access feature 30 that allows at least one laser beam 40 to pass through the top member 20. In an example, the at least one light-access feature 30 comprises one or more through openings, while in another example the light-access feature 30 can include at least one window.

The system 10 also includes a chuck 60 having an upper surface 62, a lower surface 64 and an outer edge 66. The chuck 60 is generally cylindrical in shape and is centered on Z-centerline CZ, with the upper surface 62 adjacent and parallel to the lower surface 24 of the top member 20. The chuck 60 (and thus centerline CZ) moves in the operation of system 10 as described below. The upper surface 62 of chuck 60 and lower surface 24 of top member 20 are spaced apart by a distance D1 in the range from 50 microns to 1 mm and thus define a process chamber interior ("interior") 70 with the distance D1. In an example, an upper surface 52 of a semiconductor substrate ("wafer") 50 and the lower surface 24 of top member 20 define the interior 70 and distance D1.

The upper surface 62 of chuck 60 is configured to support the wafer 50 having an upper surface 52, a lower surface 54 and an outer edge 56. In an example, the wafer 50 is a silicon wafer. The wafer 50 can be a product wafer that has undergone processing to create semiconductor devices and that is being further processed by a laser beam 40. The wafer 50 is shown as a dashed-line circle in the top-down view of FIG. 2A. In an example, the chuck 60 is heated and, in a further example, is configured to heat the wafer 50 to a wafer temperature $T_W$ of up to about 400° C. In an example, the at least one laser beam 40 comprises one or more annealing laser beams, i.e., one or more laser beams that can perform an annealing process in the wafer 50, such as, for example, dopant diffusion.

The system 10 also includes a thermal insulating layer 80 having an upper surface 82, a lower surface 84 and an outer edge 86. The thermal insulating layer 80 is arranged immediately adjacent the lower surface 64 of chuck 60 so that the thermal insulating layer 80 is in thermal communication therewith. In examples, the thermal insulating layer 80 is made of a glass or ceramic material, or is a gap. In an example, the upper surface 82 of thermal insulating layer 80 is in intimate contact with the lower surface 64 of chuck 60.

The system 10 also includes a cooling device 90 configured to thermally manage heat generated by the chuck 60 and by virtue of the laser beam 40 being incident upon the wafer 50, as described below. An example cooling device 90 includes an upper surface 92, a lower surface 94 and an outer edge 96. The cooling device 90 optionally includes a recess 98 that is defined by a support surface 100 and inner walls 102. The recess 98 is configured to accommodate the thermal insulating layer 80 and the chuck 60 so that that the thermal insulating layer 80 is supported by the support surface 100.

In an example, the inner walls 102 of cooling device 90 and outer edges 86 and 66 of thermal insulating layer 80 and chuck 60 define a gap G1. In a further example, the cooling device 90 includes one or more gas-flow channels 104 that provide a gas flow path from the support surface 100 to the lower surface 94 so that a gas 202 in the interior 70 that enters the gap G1 can flow out of the interior 70 through the cooling device 90 at the lower surface 94. The thermal insulating layer 80 can also be an air gap.

The system 10 also includes a movable stage 120 having an upper surface 122 and a lower surface 124. The system 10 further includes a ring member 150 arranged adjacent the outer edge 96 of cooling device 90 and is attached to a water-cooled reflective skirt (not shown) that surrounds a chuck assembly 68 and moves therewith. The ring member 150 has a body 151 and includes an upper surface 152, a lower surface 154, an inner surface 155 and an outer edge 156. The combination of chuck 60, thermal insulating layer 80 and cooling device 90 constitutes the chuck assembly 68. The combination of chuck assembly 68, movable stage 120 and ring member 150 constitute a movable stage assembly 128. The top member 20 is stationary relative to the movable stage assembly 128. The movable stage assembly 128 has an outside perimeter 129, which in an example is defined in part by the outer edge 156 of ring member 150.

The movable stage 120 supports the cooling device 90 on the upper surface 122. The movable stage 120 is operably connected to a positioner 126 configured to cause the movable stage 120 to move and to position the movable stage 120 as needed while also tracking the position of movable stage 120 relative to a reference position. The movable stage 120 is operably supported on a platen 130 having an upper surface 132 in a manner that allows the movable stage 120 to move in the X-Y plane.

The lower surface 24 of top member 20, outer edge 156 of ring member 150 and upper surface 132 of platen 130 define a gas curtain region 158.

In an example, the movable stage 120 and the chuck 60 are integrated to form either a unitary or a dual-component movable chuck that is operably connected to the positioner 126. The top member 20 is sufficiently long in the X-direction for the chuck 60 to move relative to the top member 20 so that the laser beams 40 can expose the entire upper surface 52 of wafer 50.

The system 10 also includes at least one gas supply system 200 and at least one coolant supply system 250 that supplies a coolant 252. In an example, a first gas supply system 200 is configured to provide a gas 202 to the interior 70, while another gas supply system 200 is configured to provide a gas 202 to the ring member 150. In one example embodiment, different gas supply systems 200 supply different gases 202, while in another example embodiment they supply the same gases 202. The ring member 150 is configured to control the flow of gas 202 into a peripheral gap G3 to form a gas curtain (not shown). The peripheral gap G3 has a width or size $W_{G3}$.

In another embodiment, a single gas supply system 200 is employed to provide gas 202 to the interior 70 and the ring member 150. An example gas 202 can include one or more inert gases, such as neon gas, argon gas, helium gas and nitrogen gas. In an example, the gas 202 consists of one or more inert gases. In another example, the gas 202 includes at least one reactive gas, such as oxygen gas, in a select amount. As discussed below, the gas 202 can comprise or consist of a forming gas that includes hydrogen gas and nitrogen gas.

The system 10 also includes a control unit 300 operably connected to the gas supply system 200 and the coolant supply system 250 and configured to control the operation of these systems 200 and 250 to form a gas curtain, as described in U.S. Pat. No. 9,029,809. The system 10 also includes a vacuum system 260 pneumatically connected to the interior 70, e.g., via at least one gas-flow channel 104 that includes a gap G2 of width $W_{G2}$. The vacuum system 260 can be used to form a vacuum in the interior 70.

Localized Control of Ambient Oxygen During Laser Annealing

Figure 2:
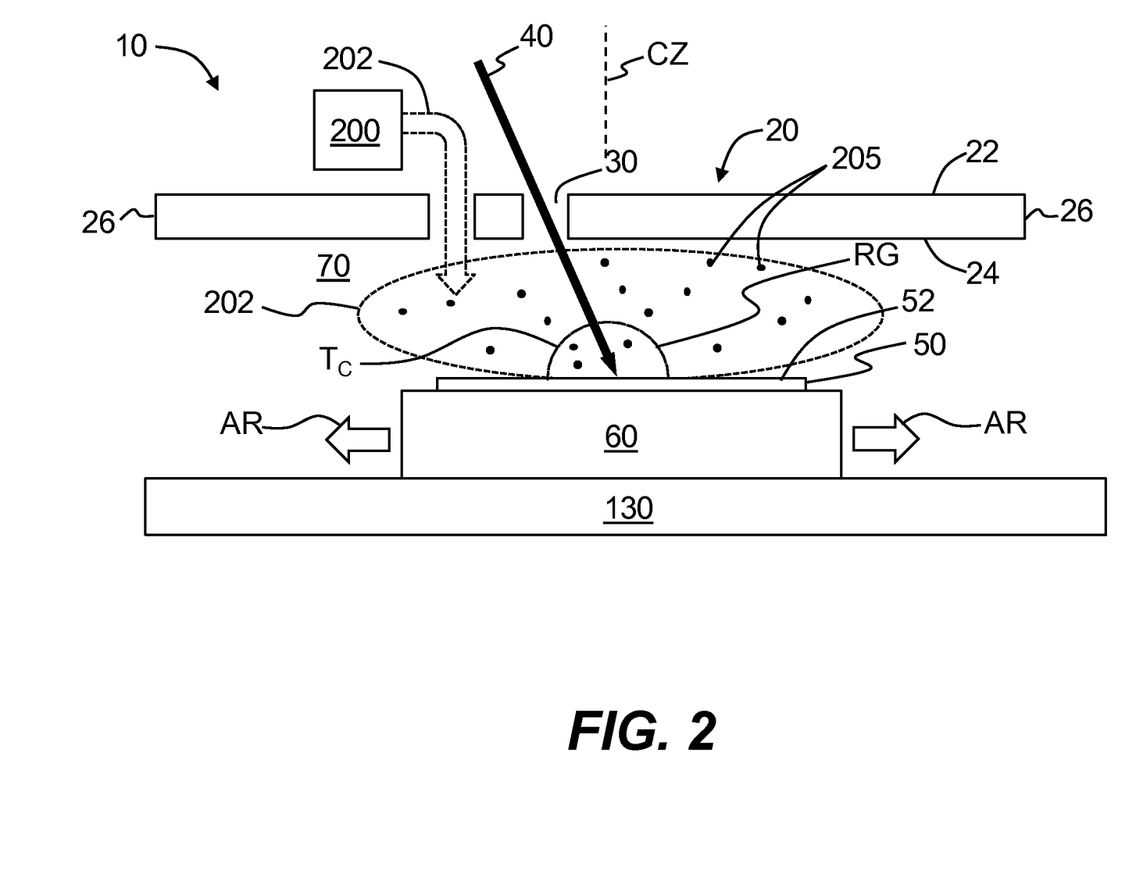
FIG. 2 is a simplified view of the process chamber system of FIG. 1A, illustrating an example annealing method that includes the formation of a localized region using a forming gas to perform localized control of ambient oxygen gas.
Figure 3A:
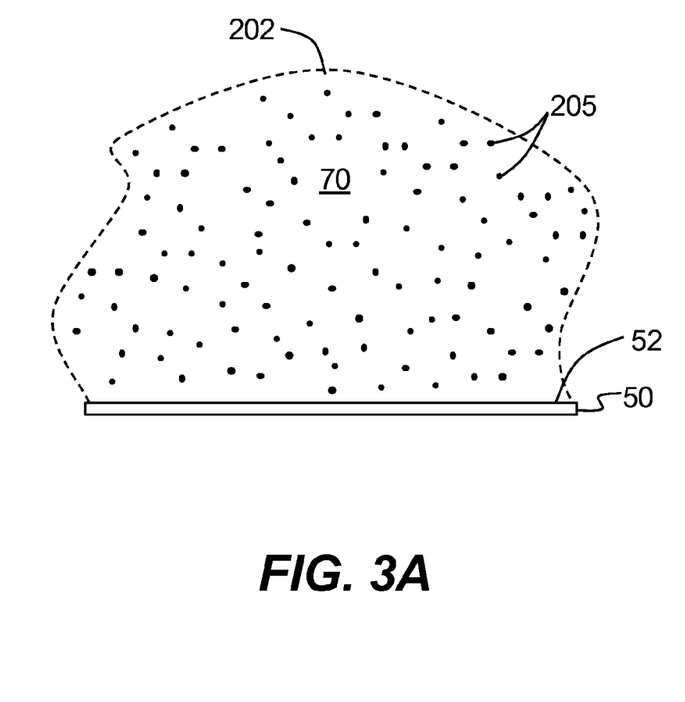
FIG. 3A is a close-up view of the surface of the semiconductor wafer in the process chamber interior after the introduction of the forming gas, showing how the forming gas and the oxygen gas are generally evenly distributed at the surface of the semiconductor wafer prior to laser annealing.
Figure 3B:
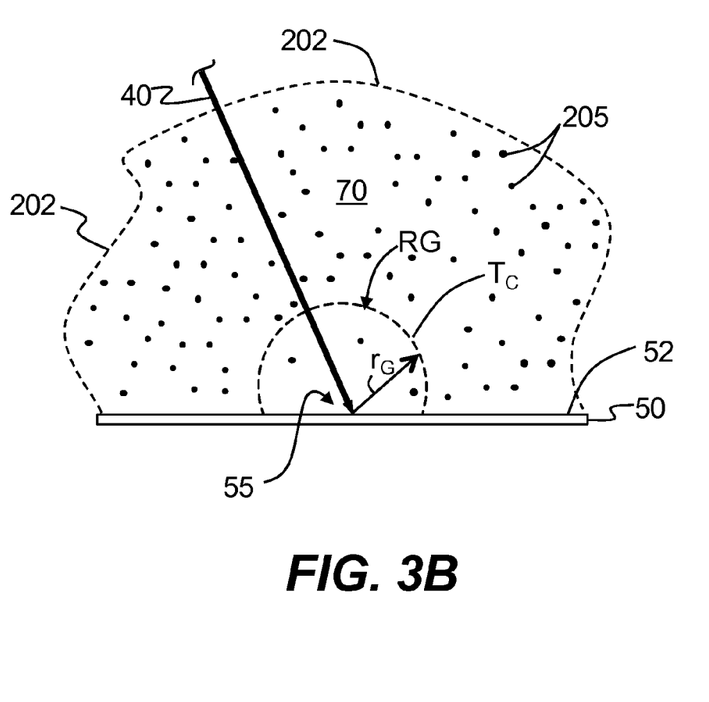
FIG. 3B is a close-up view of the localized region that surrounds the annealing location on the surface of the semiconductor wafer and that forms during the laser annealing process, wherein the oxygen gas concentration in the localized region is less than that in that in the other part of the process chamber interior due the reduction of the amount (concentration) of oxygen gas in the localized region.

FIG. 2 is a simplified view of the system 10 of FIG. 1 illustrating an example of the annealing process and the process of locally controlling the ambient oxygen gas as disclosed herein. FIG. 3A is a close-up view of a portion of the interior 70 and upper surface 52 of wafer 50 prior to annealing with the laser beam 40 and after introducing the forming gas 202 into the interior 70. The forming gas 202 is shown mixed in with oxygen gas 205. FIG. 3B is a close-up view of the laser beam 40 annealing the upper surface 52 of wafer 50 at an annealing location 55.

As noted above, it is desirable to further reduce the concentration $C_{OX}$ of oxygen gas 205 in the interior 70 to further reduce the amount of oxidization that can occur at upper surface 52 of wafer 50. While this can be accomplished throughout the interior 70, in actuality the oxygen gas concentration only needs to be reduced at the annealing location 55 where the laser annealing takes place.

Thus, in an example of the methods disclosed herein, the gas 202 is provided to the interior 70 as a forming gas 202 made of hydrogen gas and an inert buffer gas, e.g., a mixture of 5 vol % hydrogen gas ($H_2$) and 95 vol % nitrogen gas ($N_2$). The interior 70 is also evacuated (e.g., under vacuum) by the action of vacuum system 260 and so contains oxygen gas 205 with an initial or background concentration $C_{OX}$, which in an example is as low as about 50 ppm. When introduced into the interior 70, the forming gas 202 spreads (diffuses) rapidly throughout the interior 70, including to the region immediately adjacent the upper surface 52 of wafer 50, and mixes with oxygen gas 205, as shown in FIG. 3A.

The injection of the forming gas 202 into the interior 70 can be done via the operation of gas supply system 200 prior to or during the annealing process wherein the laser beam 40 is made incident upon and scans over the upper surface 52 of wafer 50 as the wafer 50 is moved relative to the laser beam 40 by moving the chuck 60, as indicated by arrows AR. In one example, the partial pressure of the forming gas 202 in the interior 70 is in the range from about 1 millitorr to about 1000 torr. In an example, the pressure in the interior 70 is less than 760 torr, i.e., less than 1 atmosphere.

During an example of the annealing process as shown in FIG. 3B, the laser beam 40 heats the upper surface 52 of wafer 50 at the annealing location 55 to an annealing temperature $T_A$, which is close to or in excess of the wafer melt temperature $T_M$, which for silicon is nominally $T_M$=1,414° C. For non-melt laser annealing, the annealing temperature $T_A$ of the upper surface 52 of wafer 50 is brought to within 400° C. of the wafer melt temperature $T_M$. For melt annealing, $T_A \geq T_M$. Note that when the wafer 50 is scanned (i.e., moved relative to the laser beam 40), the annealing location 55 "moves" relative to the upper surface 52 of wafer 50 but stays stationary relative to its initial position within the interior 70.

The heating of the upper surface 52 of wafer 50 with the laser beam 40 at the annealing location 55 also serves to locally heat the forming gas 202 and oxygen gas 205 within the interior 70, especially in the vicinity of the annealing location 55. The forming gas temperature $T_{FG}$ varies spatially within the interior 70 generally corresponds to the proximity of the forming gas 202 to the annealing location 55, i.e., the closer to the annealing location 55, the greater the forming gas temperature $T_{FG}$. It is noted here that the amount of the forming gas 202 is much greater than the amount (initial concentration $C_{OX}$) of oxygen gas 205, so that the "gas" temperature in the interior 70 is essentially defined by the forming gas 202.

FIGS. 2, 3A and 3B each show a combustion temperature contour $T_C$ for the forming gas temperature $T_{FG}$ associated with the localized heating of upper surface 52 of wafer 50 at the annealing location 55. The combustion temperature contour $T_C$ represents the combustion temperature at which the following combustion reaction occurs for the given chamber pressure within the interior 70:

$$2H_2 + O_2 \rightarrow 2H_2O \text{ vapor.} \qquad \text{Eq. 1}$$

Combustion temperature contour $T_C$ defines a localized region RG that includes a hemisphere-like portion of the interior 70 nominally centered on the annealing location 55. Within the localized region RG, the forming gas 202 has a forming gas temperature $T_{FG} \geq T_C$ and thus denotes a volume within the interior 70 within which the combustion reaction of Eq. 1 takes place.

The combustion reaction of Eq. 1 serves to reduce the concentration of oxygen gas 205 from the initial or background concentration $C_{OX}$ that exists in the interior 70 but outside the localized region RG to a lower concentration (value) $C'_{OX}$ within the localized region RG. This is illustrated schematically in FIG. 3B, in which the concentration $C_{OX}$ of oxygen gas 205 outside of the localized region RG is greater than the concentration $C'_{OX}$ within the localized region RG (i.e., $C_{OX} > C'_{OX}$).

The forming gas 202 thus serves to locally control (reduce) the amount of oxygen gas 205 within the localized region RG. This control occurs via the combustion reaction of Eq. 1, which involves breaking up the oxygen molecules ($O_2$) into O atoms and then binding the O atoms with two hydrogen atoms (2H) from the forming gas 202 to form $H_2O$ (water) vapor. This localized process occurs within the localized region RG and reduces the amount of oxidization of the upper surface 52 of wafer 50 that can take place during annealing. In an example, the concentration $C'_{OX}$ of oxygen gas 205 within the localized region RG is $C'_{OX}$ 10 ppm.

In an example embodiment, the combustion temperature within the range of partial pressures of interior 70 cited above is about $T_C$=600° C. Assuming a substantially hemispherical localized region RG centered generally on the annealing location 55, the radius $r_G$ of the localized region RG for $T_C$=600° C. can be about $r_G$=1 micron to 10 mm. The concentration of the H atoms of the forming gas 202, the rate of diffusion of the H atoms within the interior 70, the initial concentration $C_{OX}$ of oxygen gas 205 in the interior 70, and the rate of the combustion reaction of Eq. 1 are all such that the combustion reaction of Eq. 1 can initiated and sustained in a manner that substantially reduces the oxygen gas concentration $C_{OX}$ within the localized region RG as compared to the starting or initial oxygen concentration $C_{OX}$.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of laser annealing a semiconductor wafer having a surface to reduce or prevent oxidizing the surface, comprising:
   a) arranging the semiconductor wafer in an interior of a process chamber;
   b) pulling a vacuum in the interior of the process chamber such that the interior of the process chamber includes residual $O_2$ gas at an initial $O_2$ gas concentration, wherein the residual $O_2$ gas originates from air that resides in the chamber during act a);
   c) introducing a forming gas into the process chamber, the forming gas including $H_2$ and a buffer gas, and wherein no $O_2$ gas is added to the process chamber after act a); and
   d) directing a laser beam to pass through the interior of the process chamber to be incident upon the surface of the semiconductor wafer at an annealing location, thereby annealing the surface of the semiconductor wafer and also causing localized heating of the residual $O_2$ gas and the $H_2$ of the forming gas in a localized region immediately atop the wafer surface and at the annealing location and within which combustion of the residual $O_2$ gas and the $H_2$ occurs to generate $H_2O$ vapor, thereby reducing the concentration of the residual $O_2$ gas in the localized region as compared to the initial concentration of the residual $O_2$ gas.

2. The method according to claim 1, wherein the forming gas includes 5 vol % $H_2$ and 95 vol % $N_2$.

3. The method according to claim 1, wherein the localized region is defined by a combustion temperature $T_c$ in the range from 100° C. to 500° C.

4. The method according to claim 1, wherein the process chamber comprises a microchamber.

5. The method according to claim 1, further comprising moving the semiconductor wafer relative to the laser beam so that the annealing location moves relative to the surface of the semiconductor wafer but stays stationary relative to its initial position in the interior of the process chamber.

6. The method according to claim 1, wherein the initial $O_2$ gas concentration is 50 ppm(vol.) or greater and wherein the reduced $O_2$ gas concentration is 10 ppm(vol.) or smaller.

7. The method according to claim 1, wherein the semiconductor wafer has a melt temperature $T_M$, wherein the annealing of the surface of the semiconductor wafer is performed at an annealing temperature $T_A$, and wherein $T_A < T_M$.

8. A method of reducing residual oxygen gas during annealing of a semiconductor wafer having a surface, the method being directed to reducing or preventing oxidation of the surface and comprising:
   introducing a forming gas of hydrogen gas ($H_2$) and a buffer gas into a process chamber under vacuum and that contains the semiconductor wafer and the residual oxygen gas at an initial concentration, wherein the residual oxygen gas is from air that was originally present in the process chamber before the process chamber was under vacuum, and wherein no oxygen is added to the process chamber under vacuum; and
   laser annealing the surface of the semiconductor wafer at an annealing location, thereby causing localized heating of the residual oxygen gas and the hydrogen gas of the forming gas in a localized region immediately atop the wafer surface and at the annealing location and within which combustion of the residual oxygen gas and the hydrogen gas occurs to generate water vapor, thereby reducing the concentration of the residual oxygen gas in the localized region as compared to the initial concentration of the residual oxygen gas.

9. The method according to claim 8, wherein the buffer gas includes 5 vol % hydrogen gas and 95 vol % nitrogen gas.

10. The method according to claim 8, wherein the localized region is defined by a combustion temperature $T_c$ in the range from 100° C. to 500° C.

11. The method according to claim 8, wherein the process chamber comprises a microchamber.

12. The method according to claim 8, further comprising moving the semiconductor wafer relative to a laser beam so that the annealing location moves relative to the surface of the semiconductor wafer but stays stationary relative to its initial position in the interior of the process chamber.

13. The method according to claim 8, wherein the initial concentration of the residual oxygen gas is 50 ppm(vol.) or greater and wherein the reduced oxygen gas concentration is 10 ppm(vol.) or smaller.

14. The method according to claim 8, wherein the semiconductor wafer has a melt temperature $T_M$, wherein the annealing of the surface of the semiconductor wafer is performed at an annealing temperature $T_A$, and wherein $T_A < T_M$.

15. A method of laser annealing a semiconductor wafer having a surface, comprising:
   arranging the semiconductor wafer in an interior of a process chamber that includes residual $O_2$ gas at an initial $O_2$ concentration due to air originally present in the process chamber and substantially removed by pulling a vacuum;
   introducing into the process chamber a forming gas comprising $H_2$ and a buffer gas and wherein no $O_2$ gas is added to the process chamber after pulling the vacuum; and
   directing a laser beam to pass through the interior of the process chamber to be incident upon the surface of the semiconductor wafer at an annealing location, thereby annealing the surface of the semiconductor wafer and also causing localized heating of the residual $O_2$ gas and the $H_2$ of the forming gas in a localized region immediately atop the wafer surface and at the annealing location and within which combustion of the residual $O_2$ gas and the $H_2$ occurs to generate $H_2O$ vapor, thereby reducing the concentration of residual $O_2$ gas in the localized region as compared to the initial concentration of the residual $O_2$ gas.

16. The method according to claim 15, wherein the forming gas has a partial pressure in the range from 1 millitorr to 1000 torr.

17. The method according to claim 16, wherein the initial $O_2$ gas concentration is 50 ppm(vol.) or greater and wherein the reduced $O_2$ gas concentration is 10 ppm(vol.) or smaller.

18. The method according to claim 15, wherein the process chamber comprises a microchamber.

19. The method according to claim 15, wherein the buffer gas consists of 5 vol % hydrogen gas and 95 vol % nitrogen gas.

20. The method according to claim 1, wherein the forming gas has a partial pressure in the range from 1 millitorr to 1000 torr.

* * * * *

UNITED STATES PATENT AND TRADEMARK OFFICE
CERTIFICATE OF CORRECTION

PATENT NO. : 9,613,828 B2  
APPLICATION NO. : 14/714544  
DATED : April 4, 2017  
INVENTOR(S) : McWhirter et al.

Page 1 of 1

It is certified that error appears in the above-identified patent and that said Letters Patent is hereby corrected as shown below:

In Column 2, Line 46, delete the word "buffer" and insert the word --forming-- therefor.

In Column 3, Line 37, delete the word "buffer" and insert the word --forming-- therefor.

In Column 10, Claim 9, Line 7, delete the word "buffer" and insert the word --forming-- therefor.

In Column 10, Claim 19, Line 60, delete the word "buffer" and insert the word --forming-- therefor.

Signed and Sealed this  
Second Day of October, 2018

Andrei Iancu  
*Director of the United States Patent and Trademark Office*